United States Patent
Zheng et al.

(10) Patent No.: US 10,072,956 B2
(45) Date of Patent: Sep. 11, 2018

(54) SYSTEMS AND METHODS FOR DETECTING AND HANDLING A MAGNETIC ANOMALY

(71) Applicant: InvenSense, Incorporated, San Jose, CA (US)

(72) Inventors: Yuan Zheng, Fremont, CA (US); Shang-Hung Lin, San Jose, CA (US); William Kerry Keal, Santa Clara, CA (US)

(73) Assignee: InvenSense, Inc., San Jose, CA (US)

( * ) Notice: Subject to any disclaimer, the term of this patent is extended or adjusted under 35 U.S.C. 154(b) by 1084 days.

(21) Appl. No.: 14/329,531

(22) Filed: Jul. 11, 2014

(65) Prior Publication Data

US 2016/0011022 A1    Jan. 14, 2016

(51) Int. Cl.
| | |
|---|---|
| *G06F 19/00* | (2018.01) |
| *G01P 21/00* | (2006.01) |
| *G01C 17/38* | (2006.01) |
| *G01D 18/00* | (2006.01) |
| *G01R 33/00* | (2006.01) |

(52) U.S. Cl.
CPC .............. *G01D 18/00* (2013.01); *G01R 33/00* (2013.01); *G01R 33/0035* (2013.01); *G01C 17/38* (2013.01)

(58) Field of Classification Search
CPC ........ G01C 17/38; G01D 18/00; G01R 33/00; G01R 33/0035
See application file for complete search history.

(56) References Cited

U.S. PATENT DOCUMENTS

| | | | | |
|---|---|---|---|---|
| 7,275,008 B2 * | 9/2007 | Plyvanainen | .......... | G01C 17/38 324/202 |
| 2005/0126023 A1 * | 6/2005 | Kwon | .................... | G01C 17/38 33/356 |
| 2007/0101596 A1 * | 5/2007 | Olson | .................... | G01C 17/38 33/356 |
| 2009/0243775 A1 * | 10/2009 | Kim | ....................... | G01D 5/145 335/302 |
| 2011/0218769 A1 * | 9/2011 | Handa | .................... | G01C 17/38 702/181 |
| 2011/0301897 A1 * | 12/2011 | Weiss | .................... | G01C 17/38 702/85 |
| 2012/0245877 A1 * | 9/2012 | Handa | .................... | G01C 17/38 702/95 |

OTHER PUBLICATIONS

"Quaternion-Based Extended Kalman Filter for Determining Orientation by Inertial and Magnetic Sensing", by Sabatini; published Jul. 2006; IEEE Transactions on Biomedical Engineering, vol. 53, No. 7.*

* cited by examiner

*Primary Examiner* — David M Gray
*Assistant Examiner* — Geoffrey T Evans
(74) *Attorney, Agent, or Firm* — Bay Area Technology Law Group PC

(57) ABSTRACT

Systems and methods are disclosed for detecting when a magnetic anomaly may impact the quality of data being output by a magnetometer. A plurality of detection algorithms may be performed in parallel on the sensor data. Further, indication of a anomaly from one or a combination of the detection algorithms may cause the magnetometer data to have a reduced contribution in any sensor fusion operation or may be omitted from a sensor fusion operation as desired.

38 Claims, 8 Drawing Sheets

SYSTEMS AND METHODS FOR DETECTING AND HANDLING A MAGNETIC ANOMALY

FIELD OF THE PRESENT DISCLOSURE

This disclosure generally relates to techniques for processing data from a magnetometer sensor and more specifically to detecting a magnetic anomaly that may perturb the data generated by the sensor.

BACKGROUND

The development of microelectromechanical systems (MEMS) has enabled the incorporation of a wide variety of sensors into mobile devices, such as cell phones, laptops, tablets, gaming devices and other portable, electronic devices. Non-limiting examples of sensors include motion sensors, such as an accelerometer, a gyroscope and a magnetometer. In many situations, operations known as sensor fusion may involve combining data obtained from multiple sensors to improve accuracy and usefulness of the sensor data, such as by refining orientation information or characterizing a bias that may be present in a given sensor.

For example, many motion tracking systems combine data from a gyroscope, an accelerometer and a magnetometer. In particular, the magnetometer may provide the rough heading (or yaw) information for the motion tracking system. The magnetometer measures the Earth's magnetic field as experienced by the sensor. When this measurement is accurate, the magnetometer will provide heading information that may be used as a reference in the motion tracking system, such as to correct any error in a heading determination. However, data received from the magnetometer may be corrupted by magnetic disturbances or anomalies caused by nearby ferrous objects, electric fields or other circumstances. As a result, the accuracy of motion tracking performed using corrupted magnetometer data may be degraded, often to the extent that motion tracking determinations made without the magnetometer data may be superior.

Accordingly, there is a need to rapidly detect the existence of magnetic disturbances. Further, there is a need to provide such detection in a power and computationally efficient manner, particularly for devices relying on batteries or employing embedded processing. This disclosure satisfies these and other needs as described in the following materials.

SUMMARY

As will be described in detail below, this disclosure includes a method for detecting a magnetic disturbance affecting sensor data and may involve obtaining magnetometer sensor data from a device, performing a plurality of magnetic disturbance detection algorithms in parallel on the sensor data and performing a disturbance handling routine for the sensor data when the at least one magnetic disturbance detection algorithm indicates an anomaly. The disturbance handling routine may include discarding the magnetometer sensor data, assigning a reduced confidence index to the sensor data and/or performing a calibration procedure.

In one aspect, one of the magnetic disturbance detection algorithms may include determining a magnitude of a magnetic field using the magnetometer sensor data, comparing the determined magnitude to a reference magnitude and detecting a disturbance in the magnetometer sensor data when a difference between the determined magnitude and the reference magnitude exceeds a threshold. The reference magnitude may be derived from a calibration routine, from low pass filtering a plurality of samples of the magnetometer sensor data and/or location information regarding a geographical position of the magnetometer device.

In one aspect, one of the magnetic disturbance detection algorithms may include determining a three dimensional vector using the magnetometer sensor data, determining a dip angle corresponding to an angle formed by the determined three dimensional vector and a gravity vector, comparing the determined dip angle to a reference dip angle and detecting a disturbance in the magnetometer sensor data when a difference between the determined dip angle and the reference dip angle exceeds a threshold. The reference dip angle may be derived from a calibration routine, from low pass filtering a plurality of samples of the magnetometer sensor data and accelerometer data during a motionless state and/or location information regarding a geographical position of the magnetometer device.

In one aspect, one of the magnetic disturbance detection algorithms may include determining an orientation of the device, determining a three dimensional vector using the magnetometer sensor data, rotating the determined three dimensional vector to a stationary frame using the determined orientation, determining a two dimensional yaw angle from the rotated three dimensional vector, comparing the determined yaw angle to a reference yaw angle and detecting a disturbance in the magnetometer sensor data when a difference between the determined yaw angle and the reference yaw angle exceeds a threshold. The reference yaw angle may be derived from a calibration routine. Further, the orientation of the device may be determined using motion sensor data and not the magnetometer sensor data.

In one aspect, one of the magnetic disturbance detection algorithms may include determining an orientation of the device using sensor fusion without the magnetometer sensor data, determining an orientation of the device using sensor fusion with the magnetometer sensor data, comparing the orientation determined with magnetometer sensor data to the orientation determined without magnetometer sensor data and detecting a disturbance in the magnetometer sensor data when a difference between the orientation determined with magnetometer sensor data and the orientation determined without magnetometer sensor data exceeds a threshold. The method may also include identifying a change in pattern in the difference between the orientation determined with magnetometer sensor data and the orientation determined without magnetometer sensor data at a plurality of times. Further, the orientation determined with magnetometer sensor data may be a 9-axis sensor fusion and the orientation determined without magnetometer sensor data may be a 6-axis sensor fusion.

In one aspect, performing a plurality of magnetic disturbance detection algorithms on the sensor data may include performing four magnetic disturbance detection algorithms.

This disclosure is also directed to a system for detecting magnetic disturbance affecting sensor data. The system may include a magnetometer configured to output a plurality of samples of sensor data and a detection module configured to perform a plurality of magnetic disturbance detection algorithms in parallel on the sensor data and perform a disturbance handling routine for the sensor data when the at least one magnetic disturbance detection algorithm indicates an anomaly. The disturbance handling routine may include discarding the magnetometer sensor data, assigning a reduced confidence index to the sensor data and/or performing a calibration procedure.

In one aspect, the detection module may perform one of the magnetic disturbance detection algorithms by determining a magnitude of a magnetic field using the magnetometer sensor data, comparing the determined magnitude to a reference magnitude and detecting a disturbance in the magnetometer sensor data when a difference between the determined magnitude and the reference magnitude exceeds a threshold. The reference magnitude may be derived from a calibration routine, from low pass filtering a plurality of samples of the magnetometer sensor data and/or location information regarding a geographical position of the magnetometer device.

In one aspect, the detection module may perform one of the magnetic disturbance detection algorithms by determining a three dimensional vector using the magnetometer sensor data, determining a dip angle corresponding to an angle formed by the determined three dimensional vector and a gravity vector, comparing the determined dip angle to a reference dip angle and detecting a disturbance in the magnetometer sensor data when a difference between the determined dip angle and the reference dip angle exceeds a threshold. The reference dip angle may be derived from a calibration routine, from low pass filtering a plurality of samples of the magnetometer sensor data and accelerometer data during a motionless state and/or location information regarding a geographical position of the magnetometer device.

In one aspect, the system may include a sensor fusion module configured to determine an orientation of the magnetometer and the detection module may perform one of the magnetic disturbance detection algorithms by determining a three dimensional vector using the magnetometer sensor data, rotating the determined three dimensional vector to a stationary frame using the determined orientation, determining a two dimensional yaw angle from the rotated three dimensional vector, comparing the determined yaw angle to a reference yaw angle and detecting a disturbance in the magnetometer sensor data when a difference between the determined yaw angle and the reference yaw angle exceeds a threshold. The detection module may derive the reference yaw angle from a calibration routine. Further, the sensor fusion module may derive the orientation of the system using motion sensor data and not the magnetometer sensor data.

In one aspect, the system may include a sensor fusion module configured to determine an orientation of the system without the magnetometer sensor data and determine an orientation of the system with the magnetometer sensor data and the detection module may perform one of the magnetic disturbance detection algorithms by comparing the orientation determined with magnetometer sensor data to the orientation determined without magnetometer sensor data and detecting a disturbance in the magnetometer sensor data when a difference between the orientation determined with magnetometer sensor data and the orientation determined without magnetometer sensor data exceeds a threshold. The detection module may also identify a change in pattern in the difference between the orientation determined with magnetometer sensor data and the orientation determined without magnetometer sensor data at a plurality of times. Further, the orientation determined with magnetometer sensor data may be a 9-axis sensor fusion and the orientation determined without magnetometer sensor data may be a 6-axis sensor fusion.

In one aspect, the detection module may perform four magnetic disturbance detection algorithms.

DETAILED DESCRIPTION

Figure 1:
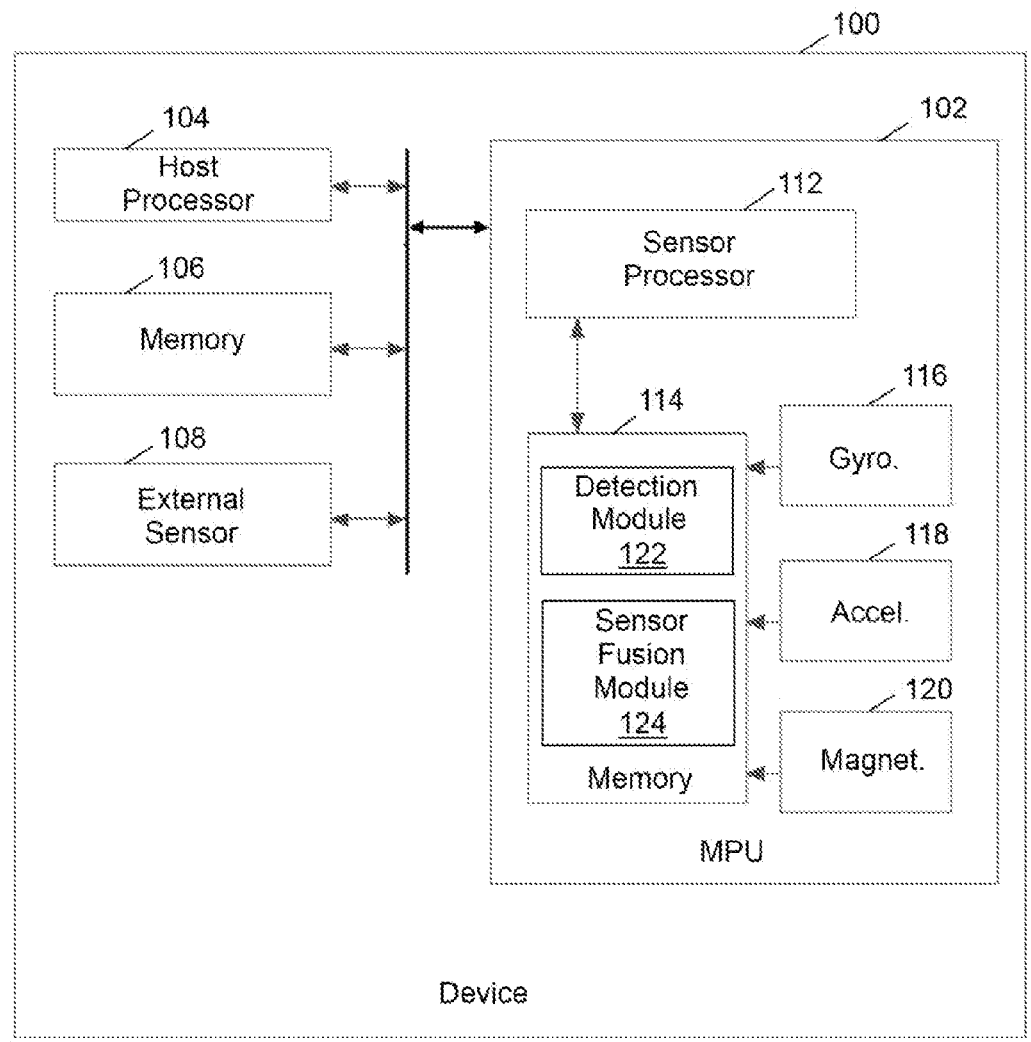
FIG. 1 is a schematic diagram of device configured to detect a magnetic disturbance affecting sensor data according to an embodiment.

At the outset, it is to be understood that this disclosure is not limited to particularly exemplified materials, architectures, routines, methods or structures as such may vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

The detailed description set forth below in connection with the appended drawings is intended as a description of exemplary embodiments of the present disclosure and is not intended to represent the only exemplary embodiments in which the present disclosure can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the disclosure in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the exemplary wireless communications devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor. For example, a carrier wave may be employed to carry computer-readable electronic data such as those used in transmitting and receiving electronic mail or in accessing a network such as the Internet or a local area network (LAN). Of course, many modifications may be made to this configuration without departing from the scope or spirit of the claimed subject matter.

The various illustrative logical blocks, modules, circuits and instructions described in connection with the embodiments disclosed herein may be executed by one or more processors, such as one or more motion processing units (MPUs), digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an MPU and a microprocessor, a plurality of microprocessors, one or more microprocessors in conjunction with an MPU core, or any other such configuration.

Unless defined otherwise, all technical and scientific terms used herein have the same meaning as commonly understood by one having ordinary skill in the art to which the disclosure pertains.

Finally, as used in this specification and the appended claims, the singular forms "a, "an" and "the" include plural referents unless the content clearly dictates otherwise.

In the described embodiments, a chip is defined to include at least one substrate typically formed from a semiconductor material. A single chip may be formed from multiple substrates, where the substrates are mechanically bonded to preserve the functionality. A multiple chip includes at least two substrates, wherein the two substrates are electrically connected, but do not require mechanical bonding. A package provides electrical connection between the bond pads on the chip to a metal lead that can be soldered to a PCB. A package typically comprises a substrate and a cover. Integrated Circuit (IC) substrate may refer to a silicon substrate with electrical circuits, typically CMOS circuits. MEMS cap provides mechanical support for the MEMS structure. The MEMS structural layer is attached to the MEMS cap. The MEMS cap is also referred to as handle substrate or handle wafer. In the described embodiments, an electronic device incorporating a sensor may employ a motion tracking module also referred to as Motion Processing Unit (MPU) that includes at least one sensor in addition to electronic circuits. The sensor, such as a gyroscope, a compass, a magnetometer, an accelerometer, a microphone, a pressure sensor, a proximity sensor, or an ambient light sensor, among others known in the art, are contemplated. Some embodiments include accelerometer, gyroscope, and magnetometer, which each provide a measurement along three axes that are orthogonal relative to each other referred to as a 9-axis device. Other embodiments may not include all the sensors or may provide measurements along one or more axes. The sensors may be formed on a first substrate. Other embodiments may include solid-state sensors or any other type of sensors. The electronic circuits in the MPU receive measurement outputs from the one or more sensors. In some embodiments, the electronic circuits process the sensor data. The electronic circuits may be implemented on a second silicon substrate. In some embodiments, the first substrate may be vertically stacked, attached and electrically connected to the second substrate in a single semiconductor chip, while in other embodiments, the first substrate may be disposed laterally and electrically connected to the second substrate in a single semiconductor package.

In one embodiment, the first substrate is attached to the second substrate through wafer bonding, as described in commonly owned U.S. Pat. No. 7,104,129, which is incorporated herein by reference in its entirety, to simultaneously provide electrical connections and hermetically seal the MEMS devices. This fabrication technique advantageously enables technology that allows for the design and manufacture of high performance, multi-axis, inertial sensors in a very small and economical package. Integration at the wafer-level minimizes parasitic capacitances, allowing for improved signal-to-noise relative to a discrete solution. Such integration at the wafer-level also enables the incorporation of a rich feature set which minimizes the need for external amplification.

In the described embodiments, raw data refers to measurement outputs from the sensors which are not yet processed. Motion data refers to processed raw data. Processing may include applying a sensor fusion algorithm or applying any other algorithm. In the case of a sensor fusion algorithm, data from one or more sensors may be combined to provide an orientation of the device. For example, data from a 3-axis gyroscope and a 3-axis accelerometer may be combined in a 6-axis sensor fusion and data from a 3-axis gyroscope, a 3-axis accelerometer and a 3-axis magnetometer may be combined in a 9-axis sensor fusion. In the described embodiments, an MPU may include processors, memory, control logic and sensors among structures.

As noted above, certain techniques of this disclosure are directed to detecting when a magnetic anomaly may impact the quality of data being output by a magnetometer. In one aspect, a plurality of detection algorithms configured to determine the existence of a magnetic anomaly are performed in parallel on the sensor data. Further, indication of a disturbance or anomaly from any one of the detection algorithms may cause the magnetometer data to have a reduced contribution in any sensor fusion operation or may be omitted from a sensor fusion operation as desired. Alternatively, indication from a plurality of algorithms or specific combinations of detections may be used to determine the existence of an anomaly.

Details regarding one embodiment of a mobile electronic device 100 including features of this disclosure are depicted as high level schematic blocks in FIG. 1. As will be appreciated, device 100 may be implemented as a device or apparatus, such as a handheld device that can be moved in space by a user and its motion and/or orientation in space therefore sensed. For example, such a handheld device may be a mobile phone (e.g., cellular phone, a phone running on a local network, or any other telephone handset), wired telephone (e.g., a phone attached by a wire), personal digital assistant (PDA), video game player, video game controller, navigation device, mobile internet device (MID), personal navigation device (PND), digital still camera, digital video camera, binoculars, telephoto lens, portable music, video, or media player, remote control, or other handheld device, or a combination of one or more of these devices.

In some embodiments, device 100 may be a self-contained device that includes its own display and other output devices in addition to input devices as described below. However, in other embodiments, device 100 may function in conjunction with another portable device or a non-portable device such as a desktop computer, electronic tabletop device, server computer, etc. which can communicate with the device 100, e.g., via network connections. The device may be capable of communicating via a wired connection using any type of wire-based communication protocol (e.g., serial transmissions, parallel transmissions, packet-based data communications), wireless connection (e.g., electromagnetic radiation, infrared radiation or other wireless technology), or a combination of one or more wired connections and one or more wireless connections. Therefore, although the primary embodiments discussed in this disclosure are in the context of a self-contained device, any of the functions described as being performed by device 100 may be implemented in a plurality of devices as desired and depending on the relative capabilities of the respective devices. As an example, a wearable device may have one or more sensors that output data to another device, such as a smart phone or tablet, which may be used to perform any or all of the other functions. However, any combination of the involved functions may be distributed among as many local and remote devices as desired. As such, the term "system" may include either a self-contained device or a combination of devices acting in concert.

As shown, device 100 includes MPU 102, host processor 104, host memory 106, and may include one or more sensors, such as external sensor 108. Host processor 104 may be configured to perform the various computations and operations involved with the general function of device 100. Host processor 104 may be coupled to MPU 102 through bus 110, which may be any suitable bus or interface, such as a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, or other equivalent. Host memory 106 may include programs, drivers or other data that utilize information provided by MPU 102. Exemplary details regarding suitable configurations of host processor 104 and MPU 102 may be found in co-pending, commonly owned U.S. patent application Ser. No. 12/106,921, filed Apr. 21, 2008, which is hereby incorporated by reference in its entirety.

In this embodiment, MPU 102 is shown to include sensor processor 112, memory 114 and gyroscope 116, accelerometer 118 and magnetometer 120. Any or all of gyroscope 116, accelerometer 118 and magnetometer 120 may be implemented as a MEMS-based inertial sensor configured to provide raw data output measured along three orthogonal axes or any equivalent structure. Memory 114 may store algorithms, routines or other instructions for processing data output by gyroscope 116, accelerometer 118 and magnetometer 120, such as detection module 122 described in detail below and sensor fusion module 124. One or more additional internal sensors may be integrated into MPU 102 as desired. If provided, external sensor 108 and/or an additional internal sensor may include one or more sensors, such as accelerometers, gyroscopes, magnetometers, pressure sensors, microphones, proximity, and ambient light sensors, and temperature sensors among others sensors. As used herein, an internal sensor refers to a sensor implemented using the MEMS techniques described above for integration with MPU 102 into a single chip. Similarly, an external sensor as used herein refers to a sensor carried on-board device 100 that is not integrated into MPU 102. Further, even though embodiments are described in the context of one or more of gyroscope 116, accelerometer 118 and magnetometer 120 being integrated into MPU 102, these techniques may be applied to non-integrated sensors, such as external sensor 108 and detection module 122 may be implemented using instructions stored in any available memory resource, such as host memory 106, that may be executed using any available processor, such as host processor 104. Still further, the functionality performed by the detection module 122 may be implemented using any combination of hardware, firmware and software.

As will be appreciated, host processor 104 and/or sensor processor 112 may be one or more microprocessors, central processing units (CPUs), or other processors which run software programs for device 100 or for other applications related to the functionality of device 100. For example, different software application programs such as menu navigation software, games, camera function control, navigation software, and phone or a wide variety of other software and functional interfaces can be provided. In some embodiments, multiple different applications can be provided on a single device 100, and in some of those embodiments, multiple applications can run simultaneously on the device 100. Multiple layers of software can be provided on a computer readable medium such as electronic memory or other storage medium such as hard disk, optical disk, flash drive, etc., for use with host processor 104 and sensor processor 112. For example, an operating system layer can be provided for device 100 to control and manage system resources in real time, enable functions of application software and other layers, and interface application programs with other software and functions of device 100. In some embodiments, one or more motion algorithm layer may provide motion algorithms for lower-level processing of raw sensor data provided from internal or external sensors. Further, a sensor device driver layer may provide a software interface to the hardware sensors of device 100. Some or all of these layers can be provided in host memory 106 for access by host processor 104, in memory 114 for access by sensor processor 112, or in any other suitable architecture. In some embodiments, it will be recognized that the exemplary architecture depicted in FIG. 1 may allow detection of a magnetic anomaly by processing data from one or more of gyroscope 116, accelerometer 118 and magnetometer 120 to be performed using MPU 102 and may not require involvement of host processor 104 and/or host memory 106. Correspondingly, the techniques of this disclosure allow for detection of a magnetic anomaly using device 100 in a power and computationally efficient manner and may be adapted for use with an embedded processor, such as sensor processor 112.

As noted above, the techniques of this disclosure may involve performing multiple detection algorithms in parallel. The Earth's magnetic field is a multi-dimensional physical phenomenon, which may be observed by 3-axis magnetometer 120 in device 100. Accordingly, a magnetic disturbance or anomaly may be manifest by perturbation of different aspects of the sensor data. In the following materials, specific embodiments of suitable detection algorithms are discussed in detail and may be configured to be triggered by one or more of these aspects. However, it should be recognized that these algorithms are exemplary and other algorithms may be used as desired. Further, each detection algorithm may be configured to determine the existence of a magnetic disturbance independently.

Figure 2:
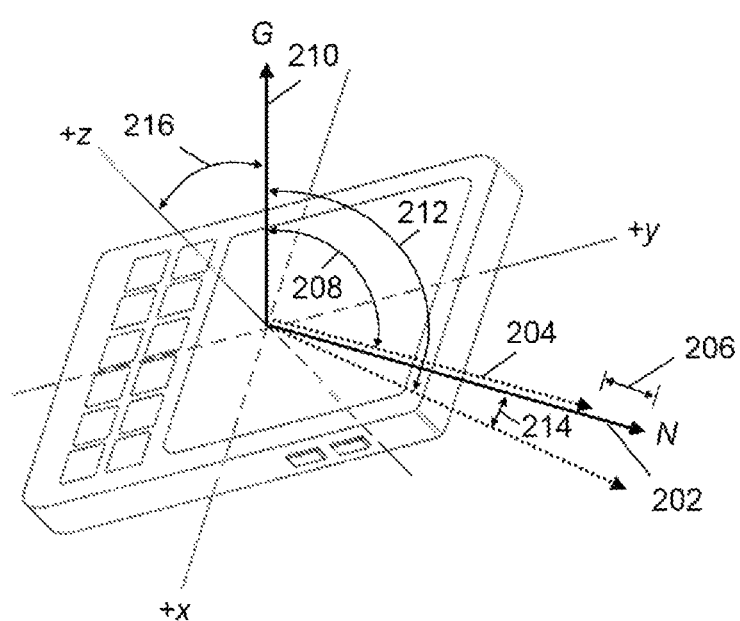
FIG. 2 is a schematic diagram of the orientation of a device, showing measured gravity and magnetometer vectors according to an embodiment.

In one aspect, a detection algorithm according to an embodiment may be based on magnetic disturbance detection with respect to the strength of the sensed magnetic field strength. For a given location, the magnitude of the magnetic field measured by magnetometer 120 may be assumed to remain essentially constant in the absence of any magnetic disturbances. As depicted in FIG. 2, magnetometer 120 may output data that corresponds to vector N 202 aligned with magnetic north. The magnitude may be determined as the square root of the sum of the square of each component of the measured vector as indicated by Equation 1.

$$m=\sqrt{x^2+y^2+z^2} \quad (1)$$

Correspondingly, the magnitude of the measured vector may be compared to a reference magnitude represented by vector 204 to determine whether the difference 206 exceeds a threshold. As will be appreciated, the threshold may be set to a value representing the desired sensitivity of detection.

Further, the magnitude of reference vector may be determined in any suitable manner. In one embodiment, the reference magnitude may be established during a calibration procedure. Alternatively or in addition, the reference magnitude may be obtained by low pass filtering a plurality of samples from magnetometer 120 with the understanding that magnetic anomalies are transitory in nature and over time, the magnitude of measured vectors will tend towards the reference magnitude. In another embodiment, the reference magnitude may be determined using the geographic location of device 100. Since the magnitude of the earth's magnetic field for a given location is known, the location of device 100 may be correlated with a reference magnitude. For example, a table of reference magnitudes may be stored locally by device 100, such as in host memory 106, or may be accessed remotely using any suitable communication method. The location of device 100 may be determined using any positioning method, including a global positioning satellite (GPS) system, Wireless Fidelity (Wi-Fi™) positioning, cellular positioning, manual input or others.

Figure 3:
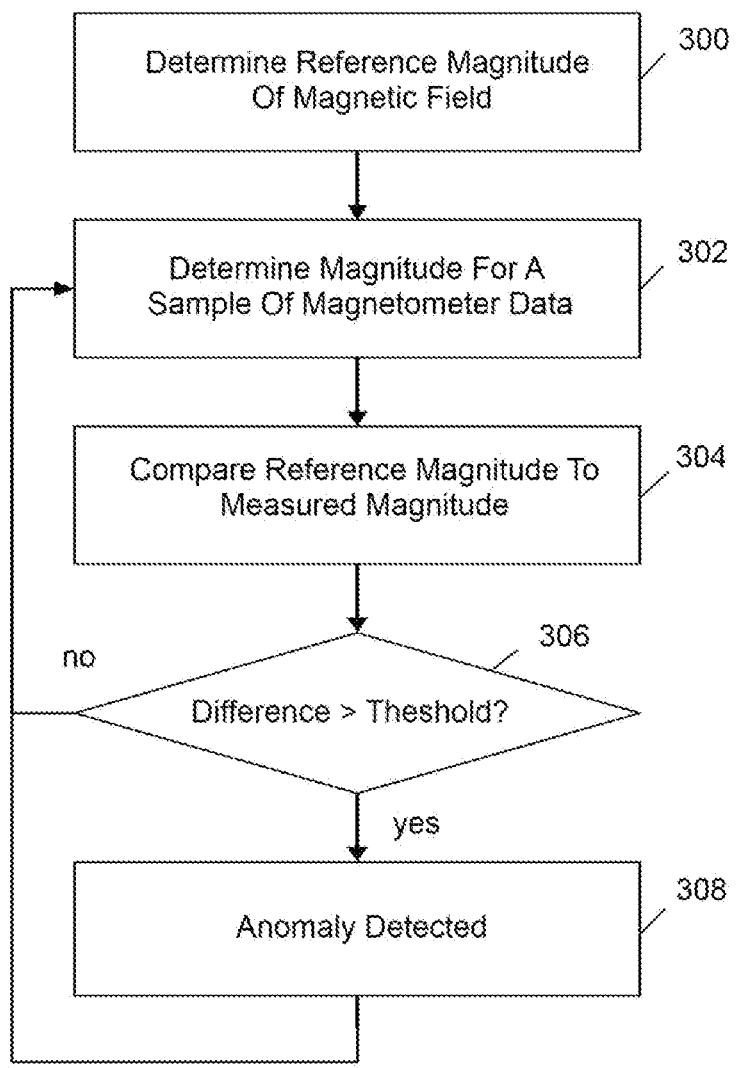
FIG. 3 is a flowchart showing a routine for detecting a magnetic disturbance using a measured magnitude according to an embodiment.

To help illustrate, FIG. 3 is a flowchart representing a detection algorithm based on magnitude that may be performed in parallel with other detection algorithms to determine the existence of a magnetic disturbance or anomaly. Beginning in 300, detection module 122 may determine a reference magnitude of the Earth's magnetic field corresponding to the location of device 100 as described above. In 302, detection module 122 then determines the magnitude of a vector representing a current sample of data as measured by magnetometer 120. The measured magnitude is compared with the reference magnitude in 304. If the difference is greater than a threshold in 306, detection module 122 may be configured to determine that an anomaly has been detected in 308 and a suitable disturbance handling routine may be implemented. For example, upon detection of an anomaly, the current sample of data from magnetometer 120 may be omitted from any sensor fusion operation, such as performed by sensor fusion module 124. Alternatively, sensor fusion module 124 or any other functional block of device 100 utilizing data from magnetometer 120 may be configured to reduce the weight given to the data. In one aspect, this may include assigning a confidence index to the sample of data, based on the difference between the measured magnitude and the reference magnitude or any other suitable criteria. Any subsequent use of the data may be modified depending on the confidence index. In another aspect, magnetometer 120 may be calibrated or recalibrated upon detection of a magnetic disturbance. After detection or if the threshold is not exceeded in 306, the routine may return to 302 to check another sample of data output by magnetometer 120.

Another detection algorithm according to an embodiment may be based on magnetic disturbance detection with respect to the dip angle of the measured magnetic field vector. For a given location, vector 202 as depicted in FIG. 2 measured by magnetometer 120 may be assumed to form a constant angle 208 with respect to a gravity vector G 208 in the absence of any magnetic disturbances. This dip angle φ may be calculated from the measured magnetometer vector 202 and the gravity vector G 210 as indicated by Equation 2.

$$\cos(\phi) = (v_m, v_g) \quad (2)$$

Similarly, the measured dip angle 208 may be compared to a reference dip angle 212 to determine whether the difference 214 exceeds a threshold. Again, the threshold may be set to a value representing the desired sensitivity of detection.

As with reference magnitude, reference dip angle 210 may be determined in any suitable manner. In one embodiment, the reference dip angle may be established during a calibration procedure. Alternatively or in addition, the reference dip angle may be obtained by low pass filtering a plurality of samples from magnetometer 120 to obtain a reference magnetic vector while gravity vector 208 may be obtained by low pass filtering a plurality of samples from accelerometer 118 during a motionless state. As such, the reference dip angle may be determined from the reference magnetic vector and gravity vector 208. Still further, the reference magnitude may be determined using the geographic location of device 100. Like the magnitude of the Earth's magnetic field, dip angle for a given location is known. Thus, the location of device 100 may be correlated with a reference dip angle as described above with respect to the reference magnitude.

Figure 4:
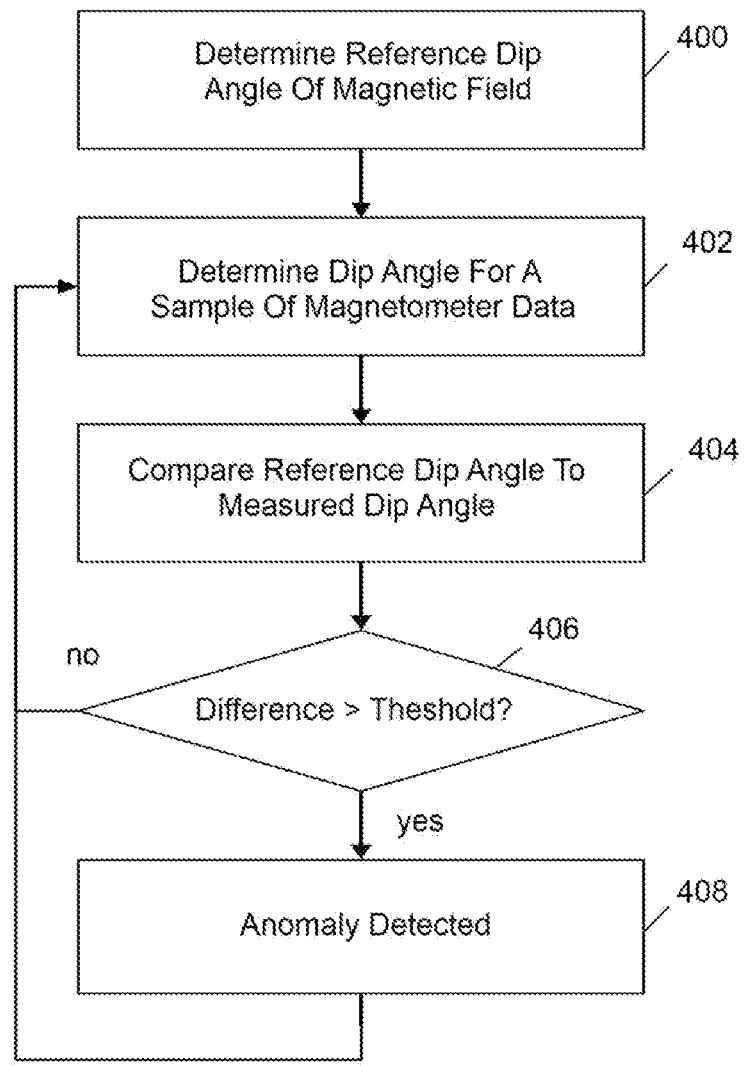
FIG. 4 is a flowchart showing a routine for detecting a magnetic disturbance using a measured dip angle according to an embodiment.

FIG. 4 depicts a flowchart representing a detection algorithm based on dip angle that may be performed in parallel with other detection algorithms to determine the existence of a magnetic disturbance or anomaly. Beginning in 400, detection module 122 may determine a reference dip angle of the Earth's magnetic field corresponding to the location of device 100 as described above. In 402, detection module 122 then determines the dip angle of a vector representing a current sample of data as measured by magnetometer 120. The measured dip angle is compared with the reference dip angle in 404. If the difference is greater than a threshold in 406, detection module 122 may be configured to determine that an anomaly has been detected in 408. Detection of an anomaly may be treated as described above. After detection or if the threshold is not exceeded in 406, the routine may return to 402 to check another sample of data output by magnetometer 120.

In yet another aspect, a detection algorithm according to an embodiment may be based on a measured yaw angle. The orientation of device 100 as depicted in FIG. 2 may be represented by rotation operation 216 that would align the Z axis of the body frame with gravity vector 210. As will be appreciated, gravity vector 210 provides a stationary frame of reference that is independent of the body frame and may be termed the "world frame." Other suitable reference frames that are independent of the body frame may be used as desired. In some embodiments, rotation operation 216 may be expressed in the form of a unit quaternion $\overline{Q}$. As used herein, the terms "quaternion" and "unit quaternion" may used interchangeably for convenience. Accordingly, a quaternion may be a four element vector describing the transition from one rotational orientation to another rotational orientation and may be used to represent the orientation of device 100. A unit quaternion has a scalar term and 3 imaginary terms. Thus, a rotation operation representing the attitude of device 100 may be described as a rotation of angle θ about the unit vector $[u_x, u_y, u_z]$ as indicated by Equation 3.

$$\overline{Q} = \begin{bmatrix} \cos\left(\frac{\theta}{2}\right) \\ \sin\left(\frac{\theta}{2}\right) \cdot u_x \\ \sin\left(\frac{\theta}{2}\right) \cdot u_y \\ \sin\left(\frac{\theta}{2}\right) \cdot u_z \end{bmatrix} \quad (3)$$

In other embodiments, rotation operation 216 may be expressed in any other suitable manner. For example, a rotation matrix employing Euler angles may be used to represent sequential rotations with respect to fixed orthogonal axes, such as rotations in the yaw, pitch and roll directions. As such, the operations described below may be modified as appropriate to utilize rotation matrices if desired.

Raw data output by magnetometer 120 may be in the form of a magnetic field component for each orthogonal axis of the body frame, such as $C_x$, $C_y$ and $C_z$. Conversion of this data to magnetic field in the world frame, $C_{wx}$, $C_{wy}$ and $C_{wz}$ may be performed readily using quaternion multiplication and inversion. For quaternions $$\overline{Q_1} = \begin{bmatrix} q_{1w} \\ q_{1x} \\ q_{1y} \\ q_{1z} \end{bmatrix}$$

-continued and $$\overline{Q_2} = \begin{bmatrix} q_{2w} \\ q_{2x} \\ q_{2y} \\ q_{2z} \end{bmatrix},$$

quaternion multiplication may be designated using the symbol "⊗" and defined as shown in Equation 4 while quaternion inversion may be designated using the symbol "'" and defined as shown in Equation 5.

$$\overline{Q_1} \otimes \overline{Q_2} = \begin{bmatrix} q_{1w} \cdot q_{2w} - q_{1x} \cdot q_{2x} - q_{1y} \cdot q_{2y} - q_{1z} \cdot q_{2z} \\ q_{1w} \cdot q_{2x} + q_{1x} \cdot q_{2w} + q_{1y} \cdot q_{2z} - q_{1z} \cdot q_{2y} \\ q_{1w} \cdot q_{2y} - q_{1x} \cdot q_{2z} + q_{1y} \cdot q_{2w} + q_{1z} \cdot q_{2x} \\ q_{1w} \cdot q_{2z} + q_{1x} \cdot q_{2y} - q_{1y} \cdot q_{2x} + q_{1z} \cdot q_{2w} \end{bmatrix} \quad (4)$$

$$\overline{Q'_1} = \begin{bmatrix} q_{1w} \\ -q_{1x} \\ -q_{1y} \\ -q_{1z} \end{bmatrix} \quad (5)$$

Therefore, conversion of magnetometer data from the body frame to the world frame may be expressed as Equation 6.

$$\overline{Q_{Cw}} = \begin{bmatrix} 0 \\ Cwx \\ Cwy \\ Cwz \end{bmatrix} = \overline{Q_{N+1}} \otimes \begin{bmatrix} 0 \\ Cx \\ Cy \\ Cz \end{bmatrix} \otimes \overline{Q'_{N+1}} \quad (6)$$

Figure 5:
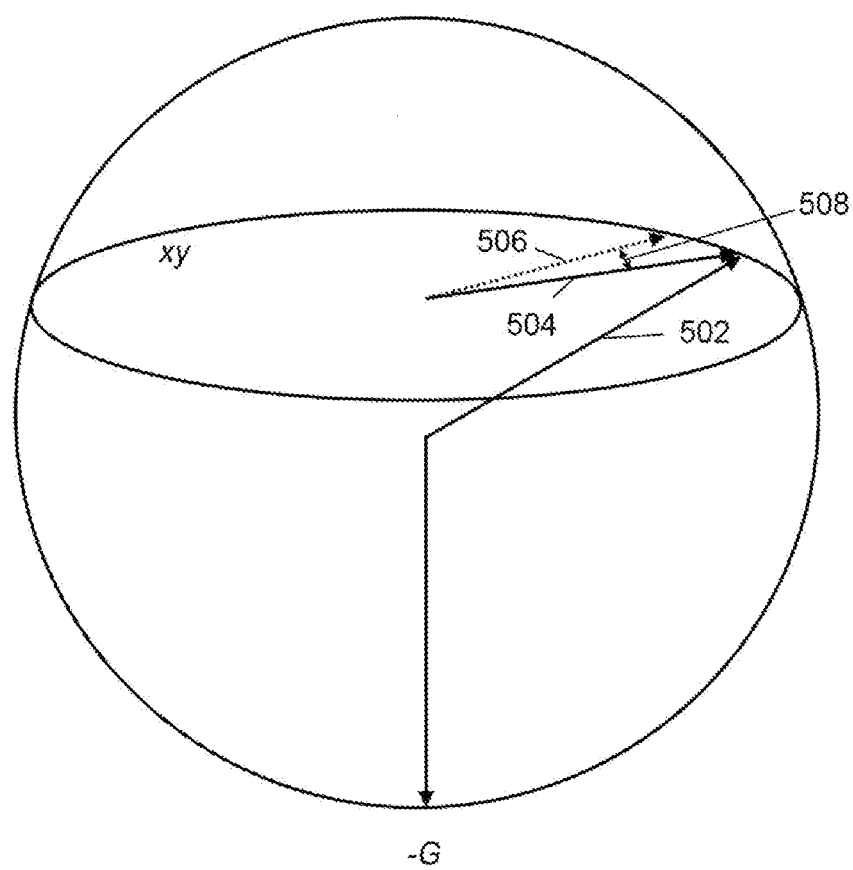
FIG. 5 is a schematic diagram showing a measured magnetometer vector and a projected yaw angle according to an embodiment.

The orientation $\overline{Q_{N+1}}$ of device 100 may be determined from a sensor fusion operation performed by sensor fusion module 124, such as a 6-axis sensor fusion involving data from gyroscope 116 and accelerometer 118 or a 9-axis sensor fusion that also includes data from magnetometer 120. As depicted in FIG. 5, the measured three dimensional vector output by magnetometer 120 may be rotated to the world frame by using Equation 6 to determine vector 502. In turn, vector 502 may be projected to the xy plane to determine a measured two dimensional yaw angle 504. Yaw angle 504 may then be compared to a reference yaw angle 506 to determine whether the difference 508 exceeds a threshold. As with the other detection algorithms, the threshold may be set to a value representing the desired sensitivity of detection. In one embodiment, the reference yaw angle may be established during a calibration procedure.

Figure 6:
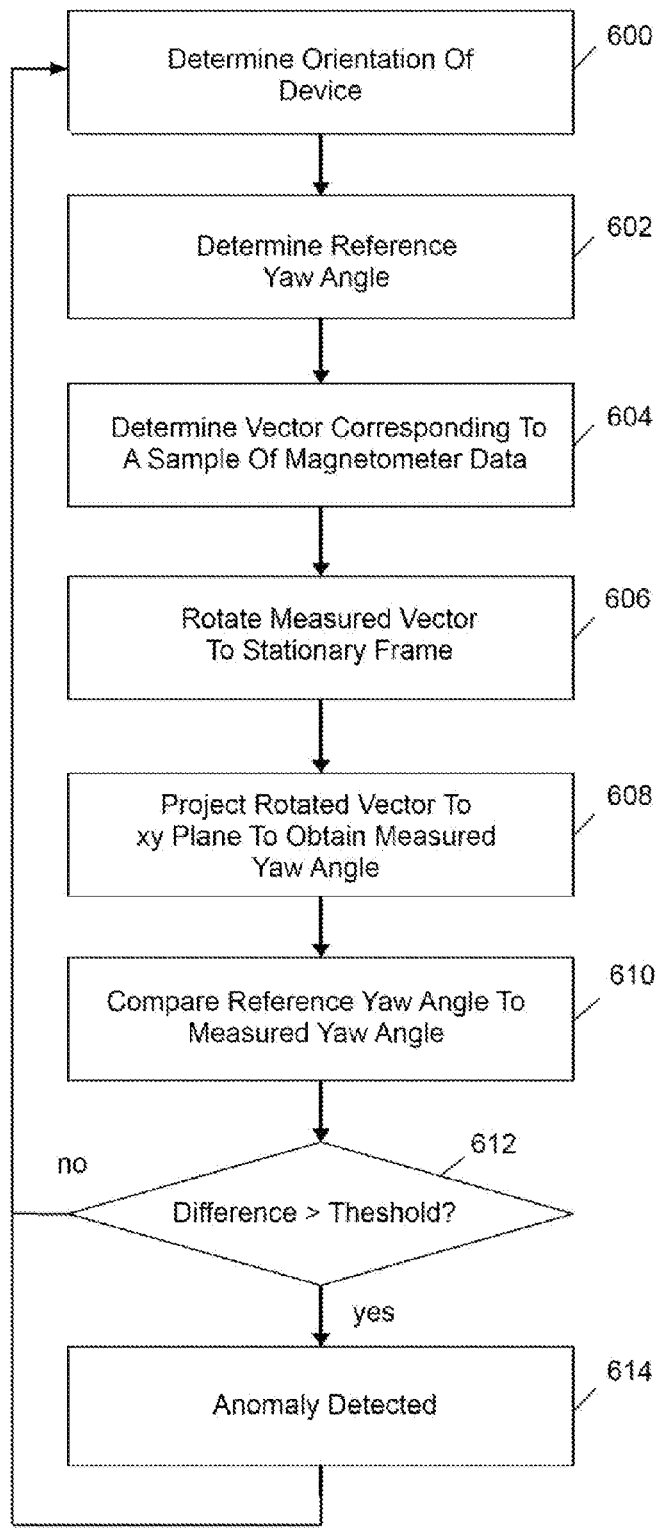
FIG. 6 is a flowchart showing a routine for detecting a magnetic disturbance using a measured yaw angle according to an embodiment.

To help illustrate this aspect of the disclosure, FIG. 6 is a flowchart representing a detection algorithm based on yaw angle that may be performed in parallel with other detection algorithms to determine the existence of a magnetic disturbance or anomaly. Beginning in 600, sensor fusion module 124 may determine an orientation of device 100 and in 602, detection module 122 may determine a reference yaw angle using the determined orientation. In 604, detection module 122 then determines a vector representing a current sample of data as measured by magnetometer 120. The measured three dimensional vector may be rotated to a stationary frame, such as the world frame, using the determined orientation in 606. Next, detection module 124 may project the measured three dimensional vector onto the xy plane to determine a measured yaw angle in 608. The measured yaw angle is compared with the reference yaw angle in 610. If the difference is greater than a threshold in 612, detection module 122 may be configured to determine that an anomaly has been detected in 614. Detection of an anomaly may be treated as described above. After detection or if the threshold is not exceeded in 612, the routine may return to 600 to check another sample of data output by magnetometer 120.

In another aspect, a detection algorithm according to an embodiment may be based on sensor fusion operations. As discussed above, the orientation of device 100 as depicted in FIG. 2 may be represented by rotation operation 216 that would align the Z axis of the body frame with gravity vector 210. Sensor fusion module 124 may update the orientation of device 100 iteratively as samples of data are received from gyroscope 116, accelerometer 118 and/or magnetometer 120. For example, data from gyroscope 116 may be integrated to update a previously determined orientation. In one example, gyroscope integration may be performed as indicated in Equation 7, wherein $\omega_m = \sqrt{\omega_1^2 + \omega_2^2 + \omega_3^2}$.

$$\overline{Q_{N+1}} = \overline{Q_N} \otimes \begin{bmatrix} \cos\frac{\omega_m}{2} \\ \frac{\omega_1}{\omega_m}\sin\frac{\omega_m}{2} \\ \frac{\omega_2}{\omega_m}\sin\frac{\omega_m}{2} \\ \frac{\omega_3}{\omega_m}\sin\frac{\omega_m}{2} \end{bmatrix} \quad (7)$$

Next, sensor fusion module 124 may convert data samples from accelerometer 118 and magnetometer 120 from the body frame to a suitable stationary frame, such as the world frame. In one embodiment, magnetometer data may be converted using Equation 6, discussed above and correspondingly, accelerometer data may be converted using Equation 8.

$$\overline{Q_{Aw}} = \begin{bmatrix} 0 \\ Awx \\ Awy \\ Awz \end{bmatrix} = \overline{Q_{N+1}} \otimes \begin{bmatrix} 0 \\ Ax \\ Ay \\ Az \end{bmatrix} \otimes \overline{Q'_{N+1}} \quad (8)$$

Sensor fusion module 124 may then update an orientation of device 100 corresponding to a current sample of data using the rotated accelerometer and magnetometer data as indicated by Equation 9.

$$\overline{Q_{N+1}} = \begin{bmatrix} 0 \\ g \cdot Awy \\ -g \cdot Awx \\ h \cdot Cwy \end{bmatrix} \otimes \overline{Q_{N+1}} \quad (9)$$

The values g and h are factors that may be configured to convert or otherwise scale the acceleration measurement unit output by accelerometer 118 and the magnetometer unit output by magnetometer 120, respectively, to an angular rate for correcting the rotation of $\overline{Q_{N+1}}$. As desired, g and/or h may represent a constant or may be dynamically determined based at least in part on a factor such as the magnitude of the measured force or a power of the magnitude to provide the appropriate scaling of the data. For example, h may be determined as indicated by Equation 10, wherein f is a suitable coefficient and $\sqrt{C_x^2+C_y^2+C_z^2}=\sqrt{C_{wx}^2+C_{wy}^2+C_{wz}^2}$.

$$h = \frac{f}{\sqrt{C_x^2 + C_y^2 + C_z^2}} \quad (10)$$

In one embodiment, the values for f, g and/or h may be stored in a look up table. In another embodiment, the values may be determined using an appropriate algorithm.

As shown in Equation 9, the term corresponding to the correction of the orientation of device based on the magnetometer data is h·Cwy. Detection module 122 may compare the orientation of device 100 as determined with the magnetometer term using Equation 9, for example, with an orientation of device 100 as determined without the magnetometer data as indicated by Equation 11.

$$\overline{Q_{N+1}} = \begin{bmatrix} 0 \\ g \cdot Awy \\ -g \cdot Awx \\ 0 \end{bmatrix} \otimes \overline{Q_{N+1}} \quad (11)$$

If the difference exceeds a threshold, detection module 122 may be configured to determine the existence of a magnetic disturbance. The threshold may be chosen to impart a desired level of sensitivity to the detection. In one aspect, the difference may be determined at a plurality of times and detection may be based on any sufficient deviation in pattern. For example, the pattern change may be assessed using techniques such as high pass filtering, sequential comparisons, state machines having transitions triggered by the determined differences, or any other suitable method.

Figure 7:
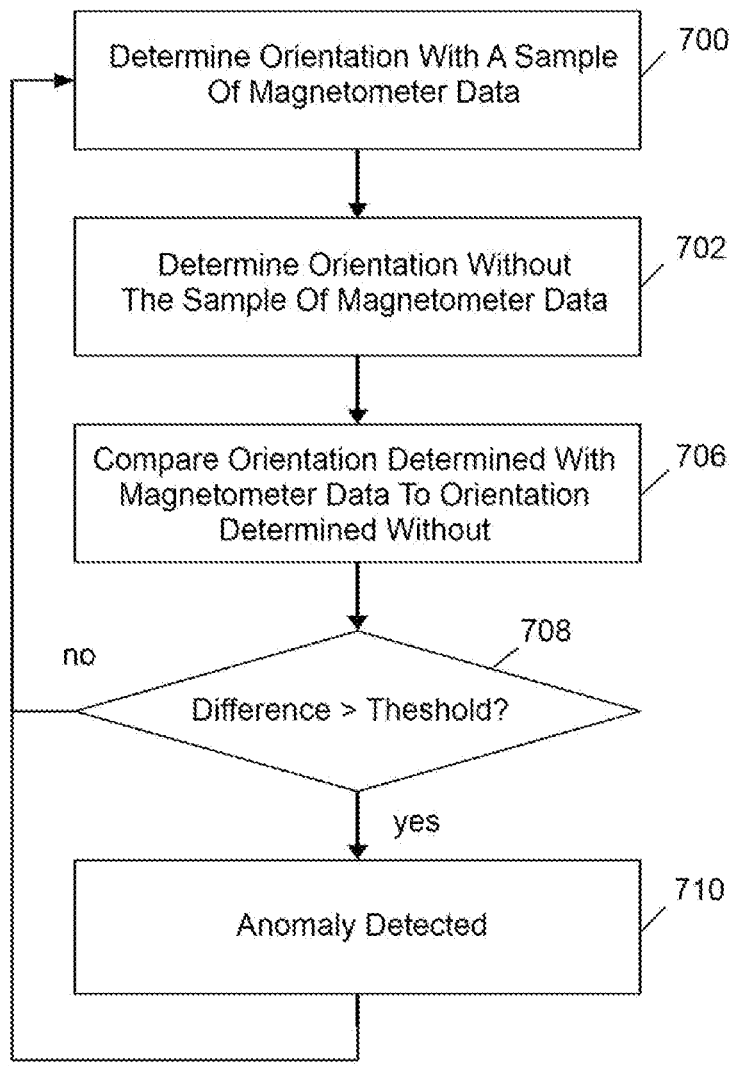
FIG. 7 is a flowchart showing a routine for detecting a magnetic disturbance using an orientation determined with and without magnetometer data according to an embodiment.

FIG. 7 is a flowchart representing a detection algorithm based on sensor fusion that may be performed in parallel with other detection algorithms to determine the existence of a magnetic disturbance or anomaly. Beginning in 700, sensor fusion module 124 may output an orientation for device 100 incorporating a sample of data from magnetometer 120, such as a 9-axis sensor fusion. In 702, sensor fusion module 124 may output an orientation for device 100 that does not incorporate magnetometer data, such as a 6-axis sensor fusion. In 704, detection module 122 may compare the orientation determined with magnetometer sensor data to the orientation determined without magnetometer sensor data. In one implementation, if the difference is suddenly greater than a threshold in 706, detection module 122 may be configured to determine that an anomaly has been detected in 708. Detection of an anomaly may be treated as described above. After detection or if the threshold is not exceeded in 706, the routine may return to 700 to verify another sample of data output by magnetometer 120.

Figure 8:
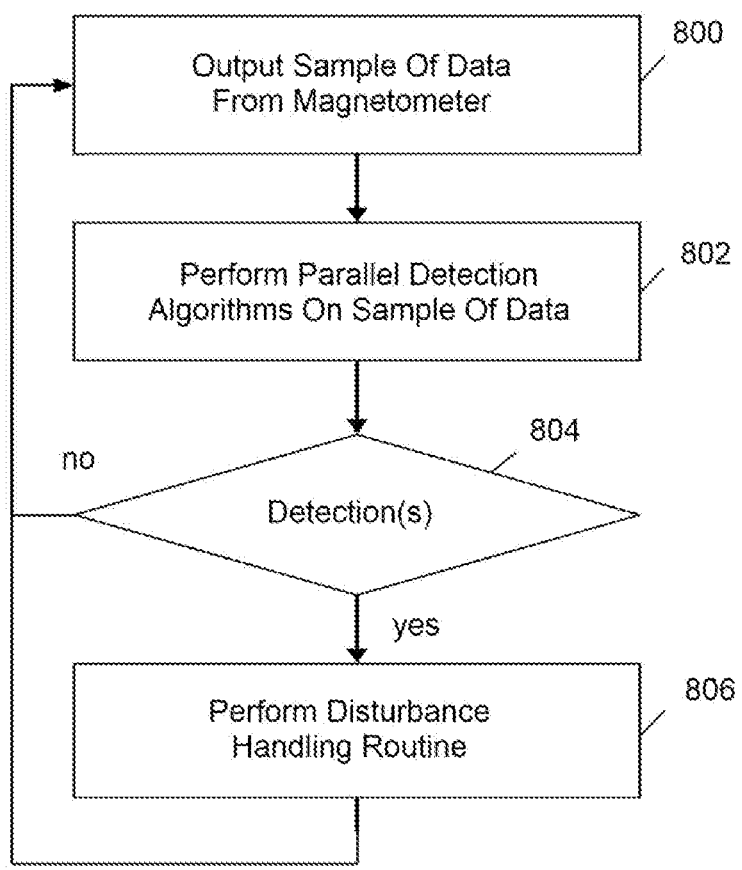
FIG. 8 is a flowchart showing a routine for detecting a magnetic disturbance using parallel magnetic disturbance detection algorithms according to an embodiment.

Further aspects of this disclosure are illustrated with respect to the flowchart shown in FIG. 8, which represents performing a plurality of parallel detection algorithms to determine the existence of a magnetic disturbance. Beginning with 800, magnetometer 120 may output a sample of data. In 802, detection module 122 may simultaneously perform a plurality of detection algorithms on the sample of data, including one or more of those detailed above, and any combination may be used. In various aspects, at least two, three or four independent detection algorithms may be used in parallel. Next, in 804, detection module 122 may determine if one or more of the detection algorithms indicate existence of a magnetic disturbance. Detection module 122 may then implement a disturbance handling routine in 806 if a specified number of detections are made with regard to the sample of data. Depending on the use case or desired level of sensitivity, a single detection may be sufficient, but any number ranging up to the number of algorithms that are being performed may be used. After detection or if the specified number of detections are not made, the sample of magnetometer data may be considered valid and the process may return to 800 to process a subsequent sample of data. As discussed above, the disturbance handling routine may involve discarding the sample of data or assigning a confidence index to selectively weight the sample of data. The confidence index may be based on the number of detections, the amount by which one or more thresholds are exceeded, or any combination thereof as well as other criteria.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method for detecting a magnetic disturbance affecting sensor data comprising:
   providing a portable device having a magnetometer;
   obtaining magnetometer sensor data from the device;
   performing a plurality of magnetic disturbance detection algorithms in parallel on the sensor data;
   performing a disturbance handling routine for the sensor data when at least one magnetic disturbance detection algorithm indicates an anomaly; and
   determining an orientation of the portable device based at least in part on the disturbance handling routine.

2. The method of claim 1, wherein the disturbance handling routine comprises discarding the magnetometer sensor data.

3. The method of claim 1, wherein the disturbance handling routine comprises assigning a reduced confidence index to the sensor data.

4. The method of claim 1, wherein the disturbance handling routine comprises performing a calibration procedure.

5. The method of claim 1, wherein one of the magnetic disturbance detection algorithms comprises:
   determining a magnitude of a magnetic field using the magnetometer sensor data;
   comparing the determined magnitude to a reference magnitude; and
   detecting a disturbance in the magnetometer sensor data when a difference between the determined magnitude and the reference magnitude exceeds a threshold.

6. The method of claim 5, wherein the reference magnitude is derived from a calibration routine.

7. The method of claim 5, wherein the reference magnitude is derived from low pass filtering a plurality of samples of the magnetometer sensor data.

8. The method of claim 5, wherein the reference magnitude is derived from location information regarding a geographical position of the device.

9. The method of claim 1, wherein one of the magnetic disturbance detection algorithms comprises:

determining a three dimensional vector using the magnetometer sensor data;
determining a dip angle corresponding to an angle formed by the determined three dimensional vector and a gravity vector;
comparing the determined dip angle to a reference dip angle; and
detecting a disturbance in the magnetometer sensor data when a difference between the determined dip angle and the reference dip angle exceeds a threshold.

10. The method of claim 9, wherein the reference dip angle is derived from a calibration routine.

11. The method of claim 9, wherein the reference dip angle is derived from low pass filtering a plurality of samples of the magnetometer sensor data and accelerometer data during a motionlessness state.

12. The method of claim 9, wherein the reference dip angle is derived from location information regarding a geographical position of the device.

13. The method of claim 1, wherein one of the magnetic disturbance detection algorithms comprises:
determining an orientation of the device;
determining a three dimensional vector using the magnetometer sensor data;
rotating the determined three dimensional vector to a stationary frame using the determined orientation;
determining a two dimensional yaw angle from the rotated three dimensional vector;
comparing the determined yaw angle to a reference yaw angle; and
detecting a disturbance in the magnetometer sensor data when a difference between the determined yaw angle and the reference yaw angle exceeds a threshold.

14. The method of claim 13, wherein the reference yaw angle is derived from a calibration routine.

15. The method of claim 13, wherein the orientation of the device is determined using motion sensor data and not the magnetometer sensor data.

16. The method of claim 1, wherein one of the magnetic disturbance detection algorithms comprises:
determining an orientation of the device using sensor fusion without the magnetometer sensor data;
determining an orientation of the device using sensor fusion with the magnetometer sensor data;
comparing the orientation determined with magnetometer sensor data to the orientation determined without magnetometer sensor data; and
detecting a disturbance in the magnetometer sensor data when a difference between the orientation determined with magnetometer sensor data and the orientation determined without magnetometer sensor data exceeds a threshold.

17. The method of claim 16, further comprising identifying a change in pattern in the difference between the orientation determined with magnetometer sensor data and the orientation determined without magnetometer sensor data at a plurality of times.

18. The method of claim 16, wherein the orientation determined with magnetometer sensor data comprises a 9-axis sensor fusion and the orientation determined without magnetometer sensor data comprises a 6-axis sensor fusion.

19. The method of claim 1, wherein performing a plurality of magnetic disturbance detection algorithms on the sensor data comprises performing four magnetic disturbance detection algorithms.

20. A system for detecting a magnetic disturbance affecting sensor data comprising:
a portable device;
a magnetometer integrated with the portable device and configured to output a plurality of samples of sensor data, and
a detection module configured to:
perform a plurality of magnetic disturbance detection algorithms in parallel on the sensor data;
perform a disturbance handling routine for the sensor data when at least one magnetic disturbance detection algorithm indicates an anomaly; and
determine an orientation of the portable device based at least in part on the disturbance handling routine.

21. The system of claim 20, wherein the disturbance handling routine comprises discarding the magnetometer sensor data.

22. The system of claim 20, wherein the disturbance handling routine comprises assigning a reduced confidence index to the sensor data.

23. The system of claim 20, wherein the disturbance handling routine comprises performing a calibration procedure.

24. The system of claim 20, wherein the detection module is configured to perform one of the magnetic disturbance detection algorithms by:
determining a magnitude of a magnetic field using the magnetometer sensor data;
comparing the determined magnitude to a reference magnitude; and
detecting a disturbance in the magnetometer sensor data when a difference between the determined magnitude and the reference magnitude exceeds a threshold.

25. The system of claim 24, wherein the detection module is configured to derive the reference magnitude is derived from a calibration routine.

26. The system of claim 24, wherein the detection module is configured to derive the reference magnitude by low pass filtering a plurality of samples of the magnetometer sensor data.

27. The system of claim 24, wherein the detection module is configured to derive the reference magnitude from location information regarding a geographical position of the magnetometer system.

28. The system of claim 20, wherein the detection module is configured to perform one of the magnetic disturbance detection algorithms by:
determining a three dimensional vector using the magnetometer sensor data;
determining a dip angle corresponding to an angle formed by the determined three dimensional vector and a gravity vector;
comparing the determined dip angle to a reference dip angle; and
detecting a disturbance in the magnetometer sensor data when a difference between the determined dip angle and the reference dip angle exceeds a threshold.

29. The system of claim 28, wherein the detection module is configured to derive the reference dip angle from a calibration routine.

30. The system of claim 28, wherein the detection module is configured to derive the reference dip angle from low pass filtering a plurality of samples of the magnetometer sensor data and accelerometer data during a motionlessness state.

31. The system of claim 28, wherein the detection module is configured to derive the reference dip angle from location information regarding a geographical position of the system.

32. The system of claim 20, further comprising a sensor fusion module, wherein the sensor fusion module is configured to determine an orientation of the magnetometer and wherein the detection module is configured to perform one of the magnetic disturbance detection algorithms by:
- determining a three dimensional vector using the magnetometer sensor data;
- rotating the determined three dimensional vector to a stationary frame using the determined orientation;
- determining a two dimensional yaw angle from the rotated three dimensional vector;
- comparing the determined yaw angle to a reference yaw angle; and
- detecting a disturbance in the magnetometer sensor data when a difference between the determined yaw angle and the reference yaw angle exceeds a threshold.

33. The system of claim 32, wherein the detection module is configured to derive the reference yaw angle from a calibration routine.

34. The system of claim 32, wherein the sensor fusion module is configured to derive the orientation of the system using motion sensor data and not the magnetometer sensor data.

35. The system of claim 20, further comprising a sensor fusion module configured to determine an orientation of the system without the magnetometer sensor data and determine an orientation of the system with the magnetometer sensor data; wherein the detection module is configured to perform one of the magnetic disturbance detection algorithms by comparing the orientation determined with magnetometer sensor data to the orientation determined without magnetometer sensor data and detecting a disturbance in the magnetometer sensor data when a difference between the orientation determined with magnetometer sensor data and the orientation determined without magnetometer sensor data exceeds a threshold.

36. The system of claim 35, wherein the detection module is further configured to identify a change in pattern in the difference between the orientation determined with magnetometer sensor data and the orientation determined without magnetometer sensor data at a plurality of times.

37. The system of claim 35, wherein the orientation determined with magnetometer sensor data comprises a 9-axis sensor fusion and the orientation determined without magnetometer sensor data comprises a 6-axis sensor fusion.

38. The system of claim 20, wherein the detection module is configured to perform four magnetic disturbance detection algorithms.

* * * * *